United States Patent [19]

Hollins

[11] 3,906,540

[45] Sept. 16, 1975

[54] METAL-SILICIDE SCHOTTKY DIODE EMPLOYING AN ALUMINUM CONNECTOR

[75] Inventor: Brian E. Hollins, Los Altos, Calif.

[73] Assignee: National Semiconductor Corporation, Santa Clara, Calif.

[22] Filed: June 20, 1974

[21] Appl. No.: 481,043

Related U.S. Application Data

[63] Continuation of Ser. No. 346,969, April 2, 1973, abandoned.

[52] U.S. Cl. .......................... 357/15; 357/67; 357/71

[51] Int. Cl.[2] .............................................. H01L 29/48

[58] Field of Search ............. 357/15, 49, 52, 48, 67, 357/68, 71

[56] References Cited

UNITED STATES PATENTS

| | | | |
|---|---|---|---|
| 3,290,570 | 12/1966 | Cunningham | 357/71 |
| 3,341,753 | 9/1967 | Cunningham et al. | 357/71 |
| 3,476,984 | 11/1969 | Tibol | 357/15 |
| 3,616,380 | 10/1971 | Lepselter et al. | 357/15 |
| 3,649,945 | 3/1972 | Waits | 357/71 |

*Primary Examiner*—Andrew J. James
*Assistant Examiner*—Joseph E. Clawson, Jr.
*Attorney, Agent, or Firm*—Lowhurst, Aine & Nolan

[57] ABSTRACT

In a Schottky diode of the type wherein a metal silicide layer interfaces with a silicon semiconductive body to form a Schottky diode, an inert barrier layer of a refractory metal, such as Mo, Ti, W, Ta and alloys thereof, is deposited overlaying and in electrical contact with the metal silicide layer. An aluminum electrical connector electrode is deposited overlaying the barrier layer for intraconnecting the Schottky diode with other devices. The refractory barrier layer prevents the aluminum from diffusing into or otherwise reacting with the metal silicide layer in such a way as to deleteriously affect the performance of the Schottky diode.

5 Claims, 1 Drawing Figure

PATENTED SEP 1 6 1975
3,906,540
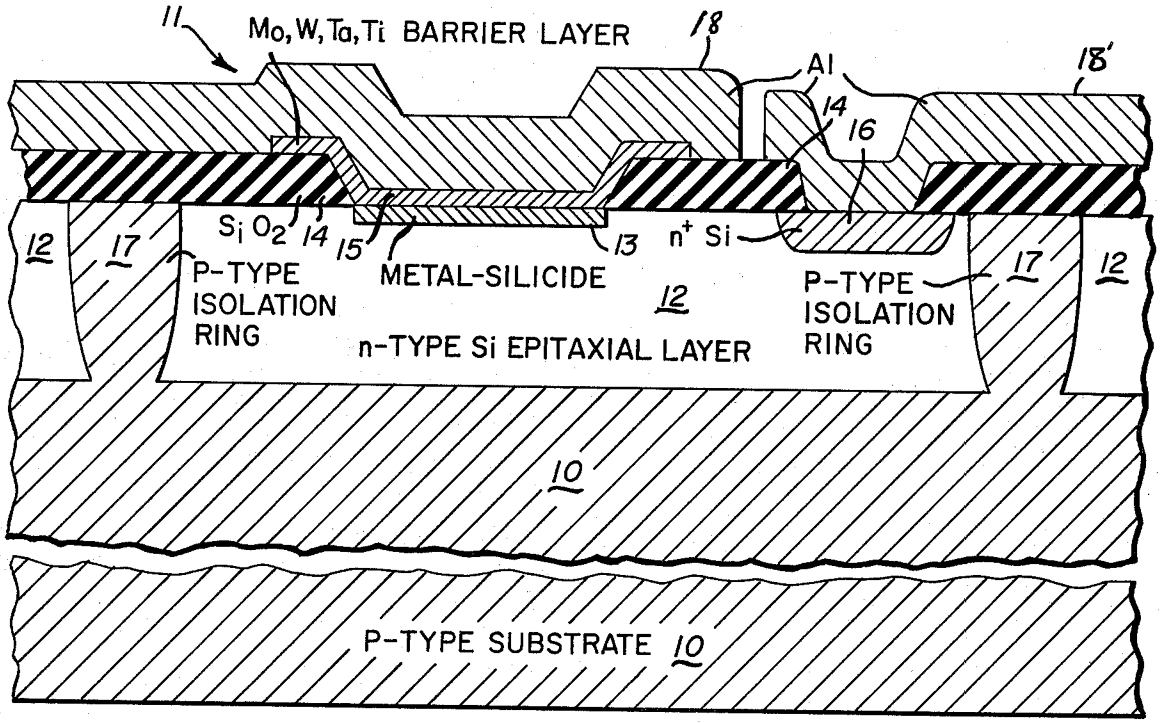

METAL-SILICIDE SCHOTTKY DIODE EMPLOYING AN ALUMINUM CONNECTOR

The present application is a continuation application of copending parent application U.S. Ser. No. 346,969, filed Apr. 2, 1973, now abandoned.

BACKGROUND OF THE INVENTION

The present invention relates in general to improved Schottky diodes and more particularly to such diodes employing a metal silicide for contacting the underlying silicon semiconductive body to form a Schottky barrier and of the type employing an aluminum connector for connecting the Schottky diode to other electrical circuitry or devices.

DESCRIPTION OF THE PRIOR ART

Heretofore, metal silicide semiconductor (Schottky) barriers have been constructed wherein a metal silicide layer contacted an underlying silicon semiconductive body to form a Schottky barrier at the interface of the metal silicide layer with the silicon semiconductive body. The metal silicide layer was intraconnected with other circuitry and devices via the intermediary of an aluminum connector electrode deposited overlaying the metal silicide layer.

The performance characteristics and construction of metalsilicide Schottky diodes are disclosed in an article titled, "Reverse Current-Voltage Characteristics of Metal-Silicide Schottky Diodes" appearing in Solid-State Electronics, Pergamon Press, 1970, vol. 13, pp. 1011–1023, printed in Great Britain.

The problem with this construction for a Schottky barrier diode is that during the processing of the metal silicide layer, contaminants and oxides are formed at the outer surface of the metal silicide layer. The aluminum intraconnector electrode is then deposited overlaying the metal silicide layer. The electrical connection to the metal silicide layer is less than perfect due to the contaminants and oxide formed at the interface between the aluminum layer and the metal silicide layer.

Accordingly, it has been the practice to subject the diode to a subsequent heat treating process wherein the diode is raised to an elevated temperature, as of 350° to 550° C, to break down the contaminant layer and to produce an intimate contact between the intraconnection layer and the metal silicide. During this heat treating step, some of the silicon of the metal silicide layer diffuses into the aluminum layer and vice versa. Aluminum has an affinity of approximately 1 to 2% for silicon within the temperature range aforementioned. The intradiffusion of aluminum and silicon can easily penetrate the silicide layer thus destroying the desired Schottky barrier diode. This undesired intradiffusion can also be encountered during subsequent treatment of the device at elevated temperatures as produced, for example, during glassivation and assembly.

SUMMARY OF THE PRESENT INVENTION

The principal object of the present invention is the provision of an improved metal-silicide Schottky diode employing an aluminum connector.

In one feature of the present invention, a refractory metal barrier is interposed between the metal silicide layer of the Schottky barrier diode and the aluminum connector layer to prevent intradiffusion of the aluminum and silicon constituents, thereby improving the operating parameters of the Schottky barrier diodes and the manufacturing yield thereof.

In another feature of the present invention, the refractory barrier layer of the Schottky diode is made of material selected from the class consisting of Mo, Ti, W, Ta and alloys thereof.

In another feature of the present invention, the metal-silicide layer of the Schottky barrier diode is made of a silicide selected from the group consisting of platinum-silicide, nickel-silicide, rhodium-silicide, palladium-silicide and zirconium-disilicide.

In another feature of the present invention, the barrier layer of refractory metal has a thickness falling within the range of 100 to 5,000 angstroms.

Other features and advantages of the present invention will become apparent upon a perusal of the following specification taken in connection with the accompanying drawings wherein:

BRIEF DESCRIPTION OF THE DRAWING

The drawing is a fragmentary transverse sectional view of a Schottky barrier diode incorporating features of the present invention.

DESCRIPTION OF THE PREFERRED EMBODIMENTS

Referring now to the drawing, there is shown a Schottky barrier diode 11 incorporating features of the present invention. The Schottky barrier diode 11 includes an epitaxial n or p type silicon semiconductive layer 12 formed on a p or n type substrate member 10. A metal silicide layer 13 as of platinum-silicide, nickel-silicide, rhodium-silicide, palladium-silicide or zirconium-disilicide is formed, as by vacuum depositing the pure metal portion of the silicide onto the substrate and sintering in vacuum to cause a reaction of the pure metal with the silicon substrate to form the metal silicide layer 13. The metal silicide layer 13 is formed to a suitable thickness such as between 100 and 5,000 angstroms. The excess metal of the metal silicide layer is chemically etched away leaving the metal silicide within an opening through a silicon dioxide insulative layer 14 which was formed on the epitaxial layer 12 before formation of the metal silicide layer 13.

A refractory metal barrier layer 15, as of Mo, W, Ta, Ti or alloys thereof, is deposited overlaying the metal silicide layer to a suitable thickness as of 100 to 5,000 angstroms. The refractory barrier layer material 15 forms an intimate electrical contact to the metal silicide layer 13 resulting in a metallurgically inert through all subsequent heat treatments experienced by the device. The excess refractory metal is then removed by a chemical etch through a developed photoresist layer.

The other terminal of the Schottky diode is formed by diffusion of an n+ or p+ conductivity region 16 into the n or p type epitaxial layer 12 through an aperture in the insulative layer 14. An electrical isolation ring 17 of p or n type material is formed encircling the Schottky barrier and the other terminal region 16 by diffusion of the ring 17 through the n or p type epitaxial layer 12 prior to formation of the insulative layer 14. The isolation ring 17 extends down into the p or n type substrate 10.

An aluminum intraconnector layer 18 is deposited, as by vacuum evaporation or sputtering, over the refractory metal barrier layer 15 and the other terminal region 16 to make intimate electrical contact therewith and, if required, with other devides such as transistors, resistors and the like. The aluminum contactor layer 18 is then chemically etched through a developed photoresist layer to form connections 18 and 18' to opposite terminals of the device 11 and to form the desired pattern of electrical intraconnections.

The Schottky barrier diode 11, in some cases, is passivated by a glassivator layer, not shown, deposited over the contactor layer electrode 18 and 18' as by chemical vapor deposition at temperatures within the range of 400° to 500° C. The passivated die may then be incorporated into a ceramic package, not shown, by conventional ceramic sealing techniques at a relatively elevated temperature, as of 500°C.

The advantage to the Schottky barrier structure of the present invention is that the refractory barrier layer 15 forms an inert electrical contactor to the metal silicide preventing diffusion of the aluminum into the metal silicide layer and vice versa. As a result, the performance and manufacturing yield for the Schottky barrier diodes of the present invention is substantially improved as contrasted with the aforecited prior art method of fabrication which does not employ the refractory barrier layer 15.

The metal-silicide Schottky diode structure of the present invention is particularly applicable to integrated circuits wherein aluminum is utilized to form electrical connections to other devices on a common substrate. In such integrated circuit devices, subsequent heat treating steps are often required for glassivation and assembly. The refractory barrier layer 15 eliminates degradation of the device resulting in improved manufacturing yield and device reliability.

What is claimed is:

1. In a Schottky diode:

a silicon semiconductive substrate;

a metal-silicide layer overlaying said semiconductive substrate in abutting relation therewith to define a Schottky barrier at the interface of said metal-silicide layer with said silicon semiconductive substrate;

a refractory metal layer abutting in overlaying relation said metal-silicide layer for making electrical contact thereto; and an aluminum metal layer abutting in overlaying relation said refractory metal layer for making electrical contact thereto.

2. The apparatus of claim 1 wherein siad refractory metal layer is made of a material selected from the group consisting of Mo, Ti, W, Ta and alloys thereof.

3. The apparatus of claim 1 wherein said metal-silicide layer is made of a material selected from the group consisting of platinum-silicide, nickel-silicide, rhodium-silicide, palladium-silicide and zirconium-disilicide.

4. The apparatus of claim 1 wherein said metal-silicide layer has a thickness falling within the range of 100 to 5,000 angstroms.

5. The apparatus of claim 1 wherein said refractory metal layer has a thickness falling within the range of 100 to 5,000 angstroms.

* * * * *